United States Patent
Longfield

(10) Patent No.: US 10,061,000 B2
(45) Date of Patent: Aug. 28, 2018

(54) MRI MAGNET FOR RADIATION AND PARTICLE THERAPY

(71) Applicant: Matthew John Longfield, Witney (GB)

(72) Inventor: Matthew John Longfield, Witney (GB)

(73) Assignee: Siemens Healthcare Limited, Camberley (GB)

( * ) Notice: Subject to any disclaimer, the term of this patent is extended or adjusted under 35 U.S.C. 154(b) by 64 days.

(21) Appl. No.: 14/071,812

(22) Filed: Nov. 5, 2013

(65) Prior Publication Data
US 2014/0128719 A1    May 8, 2014

(30) Foreign Application Priority Data

Nov. 6, 2012 (GB) .................................. 1219943.6

(51) Int. Cl.
*G01R 33/48*   (2006.01)
*G01R 33/3815*   (2006.01)

(52) U.S. Cl.
CPC ..... *G01R 33/4808* (2013.01); *G01R 33/3815* (2013.01)

(58) Field of Classification Search
CPC ........................ G01R 33/4808; G01R 33/3815
USPC ........................................................ 600/411
See application file for complete search history.

(56) References Cited

U.S. PATENT DOCUMENTS

| | | | |
|---|---|---|---|
| 6,504,899 B2 * | 1/2003 | Pugachev et al. ............... | 378/65 |
| 6,570,475 B1 * | 5/2003 | Lvovsky .............. | G01R 33/421 |
| | | | 324/319 |
| 6,909,348 B2 * | 6/2005 | Kakugawa et al. .......... | 335/301 |
| 7,828,744 B2 * | 11/2010 | Rioux et al. ................... | 600/562 |
| 8,915,833 B1 * | 12/2014 | Sahadevan ........... | A61N 5/1027 |
| | | | 600/1 |
| 2004/0184579 A1 * | 9/2004 | Mihara ..................... | A61N 5/10 |
| | | | 378/65 |
| 2005/0182315 A1 * | 8/2005 | Ritter .................. | G01R 33/3806 |
| | | | 600/411 |
| 2005/0261576 A1 | 11/2005 | Speier et al. | |
| 2007/0016014 A1 * | 1/2007 | Hara ......................... | A61N 5/10 |
| | | | 600/426 |
| 2007/0241754 A1 * | 10/2007 | Hirata .............. | G01R 33/56563 |
| | | | 324/312 |
| 2008/0116889 A1 * | 5/2008 | Hu et al. ....................... | 324/309 |

(Continued)

FOREIGN PATENT DOCUMENTS

| | | |
|---|---|---|
| GB | 2490325 A | 10/2012 |
| WO | 9932189 A1 | 7/1999 |

(Continued)

*Primary Examiner* — Bo J Peng
*Assistant Examiner* — Lisa Kinnard
(74) *Attorney, Agent, or Firm* — Schiff Hardin LLP

(57) ABSTRACT

In an MRI magnet structure for use with a radiation beam source as an assembly, magnet coils of varying diameters are concentrically arranged along a magnetic axis, the magnetic coils not sharing a common inner or outer radius. Mechanical support is provided to retain the magnetic coils in necessary relative fixed positions. The patient bore tube is provided through the assembly and defines a patient bore axis in an essentially horizontal direction such that the magnetic axis is inclined to the patient bore axis by an angle of 30°-60°. At least one radiation therapy beam access cavity provides access in a straight line for a radiation therapy beam to reach a treatment region within the magnet structure.

17 Claims, 4 Drawing Sheets

(56) References Cited

U.S. PATENT DOCUMENTS

| | | | |
|---|---|---|---|
| 2008/0180100 A1* | 7/2008 | Ando | G01R 33/421 |
| | | | 324/318 |
| 2008/0208036 A1 | 8/2008 | Amies et al. | |
| 2008/0269596 A1* | 10/2008 | Revie et al. | 600/424 |
| 2009/0124887 A1 | 5/2009 | Roell et al. | |
| 2010/0113911 A1 | 5/2010 | Dempsey | |
| 2010/0174172 A1* | 7/2010 | Ein-Gal | A61B 5/055 |
| | | | 600/411 |
| 2010/0202587 A1* | 8/2010 | Schmidt | A61B 6/02 |
| | | | 378/62 |
| 2011/0118588 A1* | 5/2011 | Komblau et al. | 600/411 |
| 2011/0201920 A1* | 8/2011 | Allen | A61N 5/1042 |
| | | | 600/411 |
| 2011/0211665 A1* | 9/2011 | Maurer et al. | 378/9 |
| 2011/0230754 A1* | 9/2011 | Overweg | A61N 5/1049 |
| | | | 600/411 |
| 2012/0253096 A1* | 10/2012 | Teshigawara | A61N 5/1049 |
| | | | 600/1 |
| 2013/0035584 A1* | 2/2013 | Fahrig et al. | 600/411 |

FOREIGN PATENT DOCUMENTS

| | | | | |
|---|---|---|---|---|
| WO | 2004024235 A1 | 3/2004 | | |
| WO | 2006136865 A1 | 12/2006 | | |
| WO | 2007045076 A1 | 4/2007 | | |
| WO | 2009155700 A1 | 12/2009 | | |
| WO | 2011000077 A1 | 1/2011 | | |
| WO | 2011008969 A1 | 1/2011 | | |
| WO | WO 2011042820 A1 * | 4/2011 | | A61N 1/403 |
| WO | WO 2011086477 A1 * | 7/2011 | | A61N 5/1067 |
| WO | WO 2012080894 A2 * | 6/2012 | | A61N 5/1067 |
| WO | WO 2012135771 A1 * | 10/2012 | | A61B 6/037 |

\* cited by examiner

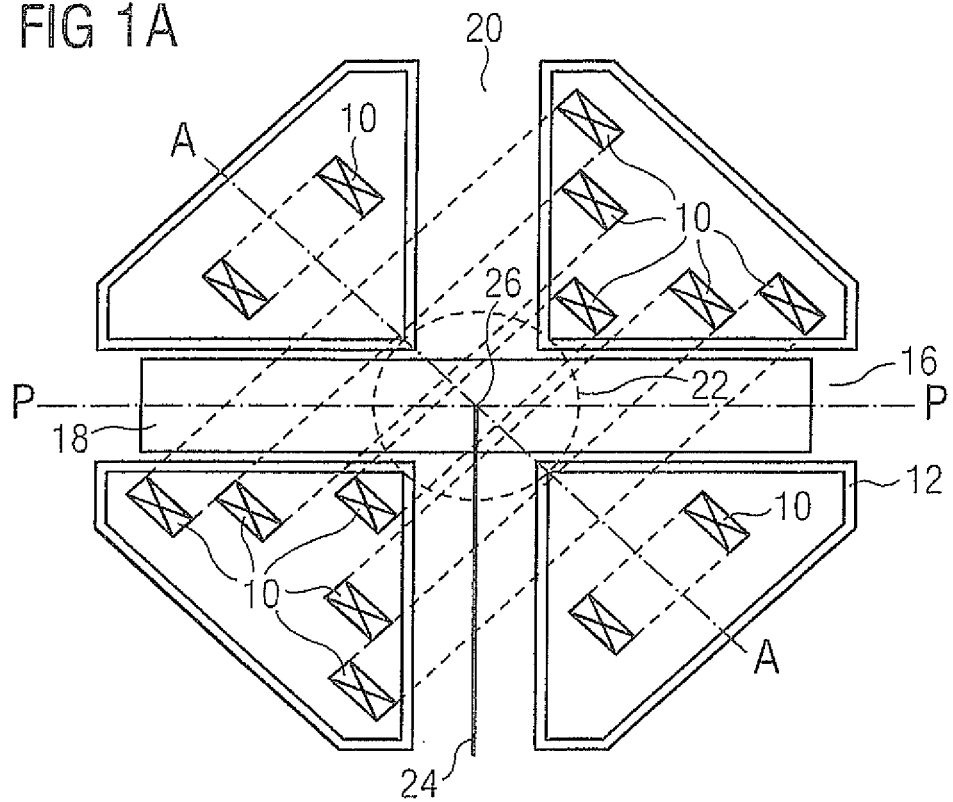
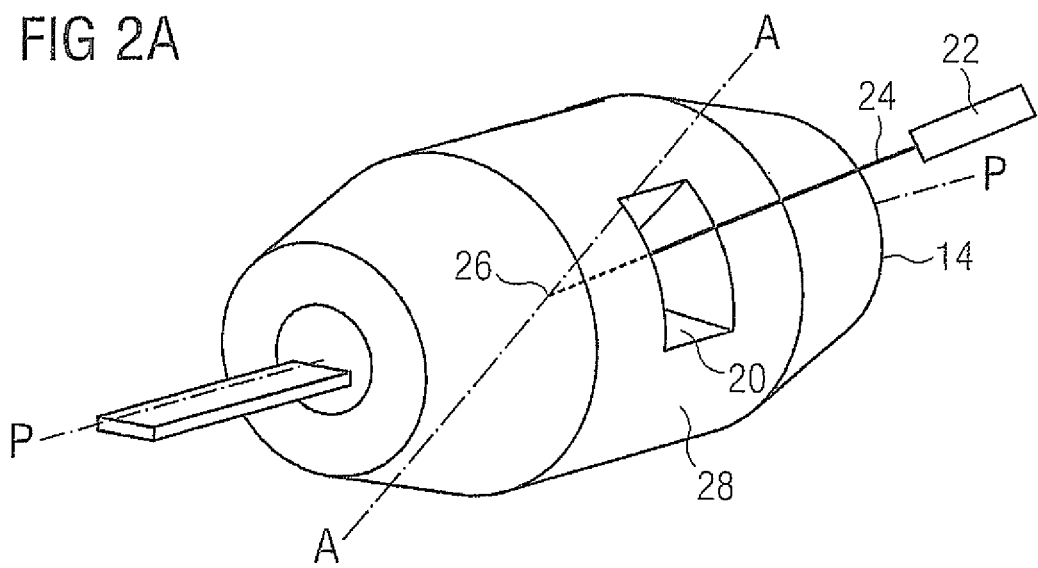

MRI MAGNET FOR RADIATION AND PARTICLE THERAPY

BACKGROUND

The present disclosure relates to a type of superconducting magnet useful as part of an MRI system in a combined MRI and radiation-therapy equipment. An important advantage of a combined MRI and radiation-therapy apparatus is that MRI imaging may be performed near-simultaneously, or in some arrangements, simultaneously, with radiation therapy, to ensure accurate location of treatment targets such as tumors and real-time monitoring of the effectiveness of applied radiation therapy. By combining MRI imaging and radiation therapy, the radiation can be targeted more accurately and the hospital workflow will be more efficient.

Several attempts have been made to provide combined MRI and radiation therapy equipment, but have often resulted in unwieldy apparatus and/or restricted operating parameters such as magnetic field strength or radiation dose.

Two types of radiation may be employed in radiation therapy techniques applicable to the present disclosure:
charged particles; and
electromagnetic radiation.

Charged particle radiation involves a beam of charged particles, such as electrons or helium nuclei, accelerated by an electrostatic or magnetic accelerator and directed towards a treatment. Electrostatic or magnetic beam focusing and targeting equipment may be used to ensure that the beam reaches the required treatment area, with minimal impact on healthy tissue which does not require treatment. A difficulty with arranging such treatment in conjunction with MRI imaging is that the background magnetic field required for MRI imaging will deflect and disperse the radiation beam unless it is directed precisely parallel to the magnetic field in the region of treatment. This causes difficulty for access of the beam to the treatment region, and difficulty for the beam to reach the treatment region without passing through a substantial part of a patient's body, which is undesirable due to the increased exposure of a patient to the radiation, and the dispersion of the radiation beam and reduction of radiation dose at the treatment site.

Electromagnetic radiation therapy involves directing a beam of high-frequency electromagnetic waves, such as gamma-radiation or "hard" X-rays towards the treatment region. An advantage of electromagnetic radiation therapy is that the treatment beams are not deflected by the magnetic field of the MRI imaging system, but a disadvantage lies in the sometimes large and costly apparatus required to generate the treatment beams.

Some of the known approaches to providing combined MRI and radiation therapy apparatus appear in the following publications:

Radiotherapy Machine Including Magnetic Resonance Imaging System—WO 99/32189—describes an open magnet with radiation beam parallel to MRI magnetic field, in which the radiation beam does not interact with coils or the MRI field.

MRI in guided radiotherapy apparatus with beam heterogeneity compensators—WO 2004/024235 A1—describes use of a charged particle radiation beam perpendicular to the magnetic field, with local correction to reduce the effects of background field on particle trajectory.

System for delivering conformal radiation therapy while simultaneously imaging soft tissue—US 2010/0113911 A1—describes a split-solenoidal MRI magnet with a radiation source on a gantry which rotates about the magnet axis.

Particle Radiation Therapy Equipment Comprising Magnetic Resonance Imaging Means—WO 2006/136865 A1—describes an open magnet with transverse field and a charged particle beam applied transversely, parallel to the magnetic field.

Integrated External Beam Radiotherapy and MRI System—WO 2007/045076—describes a low-field open magnet with integrated coils and linear accelerator radiation source.

Combined Radiation Therapy and Magnetic Resonance Unit—US 2008/0208036—describes a solenoidal magnet with a linear accelerator within the bore of the magnet, delivering a radial radiation beam.

Device for Radiation Therapy Under Image Monitoring—US 2009/0124887 A1—describes a radiation beam perpendicular to a magnetic field, with a rotating patient table and static radiation source.

Radiation Therapy System—WO 2009/155700 A1—describes an open magnet with a charged particle radiation beam directed parallel to the magnetic field.

Image Guided Radiation Therapy—WO 2011/000077 A1—describes a restraining patient table for combined MRI/radiation therapy.

Method and apparatus for shielding a linear accelerator and a magnet resonance imaging device from each other—WO 2011/008969 A1—describes a split solenoid MRI system with linear accelerator radiation source, and RF shielding to reduce interference between the MRI system and the linear accelerator.

SUMMARY

It is an object to provide an improved apparatus for combined MRI imaging and radiation therapy.

In an MRI magnet structure for use with a radiation beam source as an assembly, magnet coils of varying diameters are concentrically arranged along a magnetic axis, the magnetic coils not sharing a common inner or outer radius. Mechanical support is provided to retain the magnet coils in necessary relative fixed positions. The patient bore tube is provided through the assembly and defines a patient bore axis in an essentially horizontal direction such that the magnet axis is inclined to the patient bore axis by an angle of 30°-60°. At least one radiation therapy beam access cavity provides access in a straight line for a radiation therapy beam to reach a treatment region within the magnet structure.

The above, and further, objects, characteristics and advantages of the present exemplary embodiments will become more apparent from the following description of those embodiments thereof, given by way of non-limiting example only, in conjunction with the appended drawings.

BRIEF DESCRIPTION OF THE DRAWINGS

FIG. 1A shows a schematic horizontal axial cross-section, a plan view, through an MRI magnet according to another embodiment of the present invention;

FIG. 2A schematically illustrates a three-dimensional representation of the magnet of FIG. 1A;

DESCRIPTION OF EXEMPLARY EMBODIMENTS

Figure 1:
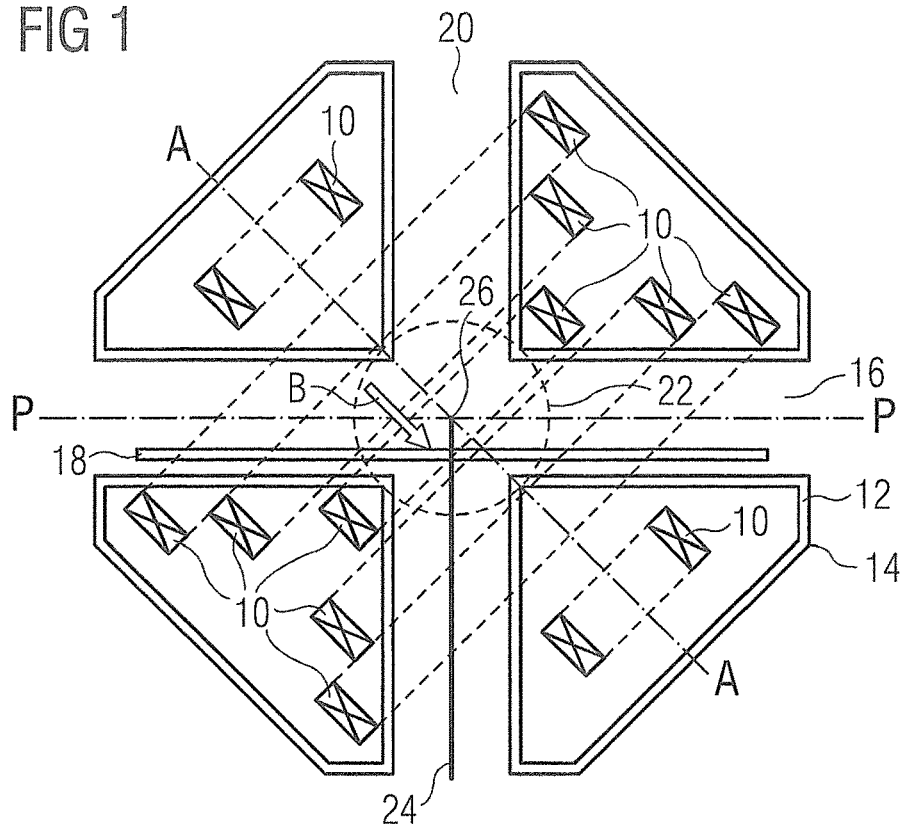
FIG. 1 shows a schematic vertical axial cross-section, an elevation view, through an MRI magnet according to an embodiment of the present invention.

For purposes of promoting an understanding of the principles of the invention, reference will now be made to the preferred exemplary embodiments/best mode illustrated in the drawings and specific language will be used to describe the same. It will nevertheless be understood that no limitation of the scope of the invention is thereby intended, and such alterations and further modifications in the illustrated embodiments and such further applications of the principles of the invention as illustrated as would normally occur to one skilled in the art to which the invention relates are included herein.

In standard MRI systems, the background static magnet field is directed parallel to the patient bed, whereas at least some embodiments of the present invention employ a background static magnetic field which is directed at about 45 degrees to the surface of the patient bed. Typically, an arrangement of coils for generating the background static magnetic field for MRI system has a pair of rectangular coils located on opposite sides of an imaging region to produce the static background magnetic field.

In the arrangement illustrated in FIG. 1, superconducting magnet coils 10 of varying diameters are concentrically arranged along a magnet axis A-A. Unconventionally, the coils do not share a common inner or outer radius. Appropriate mechanical support, which may be designed by those skilled in the art without resort to inventive faculty, is provided (but not illustrated) to retain the coils in the necessary relative fixed positions. An outer vacuum container (OVC) 14 is provided, enclosing the coils 10 within a vacuum. Thermal radiation shield(s) 12 is/are provided between the coils and the OVC to reduce thermal influx to the coils by radiation form the OVC. FIG. 4c shows a view of another embodiment, in which a support frame 60 is shown.

As illustrated, the axis A-A is inclined to the horizontal by about 45°. A patient bore tube 16 is provided through the assembly, in an essentially horizontal direction. The positioning of the coils 10 must be arranged such that a patient bore tube 16 of sufficient dimensions to accommodate the intended patients may be provided without conflict with the positions of the coils. A patient bed 18, of essentially conventional design and construction, is preferably provided to enable transport of patients into and out of the patient bore tube 16. A radiation therapy beam access cavity 20 is provided, and is approximately vertically orientated, and is approximately perpendicular to the patient bore tube 16. A treatment beam 24 of electromagnetic radiation may be directed through the radiation therapy beam access cavity 20 to a treatment region 26, at an angle to the static background magnetic field B generated by coils 10. The electromagnetic radiation beam 24 (e.g. a beam of gamma radiation) is unaffected by the magnetic field.

The coils are arranged so that a treatment region 22 containing an isocenter 26 of the magnet is accessible in a straight line through patient bore tube 16 and radiation therapy beam access cavity 20. Both the patient bore tube 16 and the radiation therapy beam access cavity 20 extend at an angle of approximately 45° to the magnet axis A-A. This angle may, however, take other values and a range of between 30°-60° may be found suitable.

The superconducting coils 10 generate a substantially homogenous static magnetic field B in an imaging region 22. Although not illustrated, a gradient coil assembly and RF/body coils will be provided within the patient bore 16. The design of such a gradient coil assembly and RF/body coils can be derived by those skilled in the art using conventional modelling and design tools. FIG. 4b shows another embodiment of the present invention, where gradient coils 62 and RF/body coils 64 are illustrated. Conventional RF/body coils can be used, positioned directly onto the patient table.

The potential problem of scattering of an electromagnetic treatment beam by metallic cryostat components in the patient bore may be addressed by providing appropriate beam tubes which can be slotted into the cryostat vessel 14 to provide a clear path for the incident radiation beam 24 to travel to the target at the center 26 of the magnet. FIG. 4a illustrates another embodiment of the present invention, in which beam tubes 66 are visible.

The scattering of the electromagnetic radiation treatment beam by gradient coils, RF coils and passive shim iron in the magnet bore may be reduced or avoided by orientating the treatment radiation beam 24 by about 45 degrees to the horizontal, rather than at 90 degrees to the horizontal as has been proposed in the prior art. This selection of angle of direction of the treatment beam allows the treatment beam to avoid contact with the gradient coil, RF coil and passive iron shims etc. FIG. 4b shows another embodiment of the present invention, but illustrates how the orientation of the treatment beam may be selected to avoid contact with gradient coils, RF coils and shims and so on.

Figure 2:
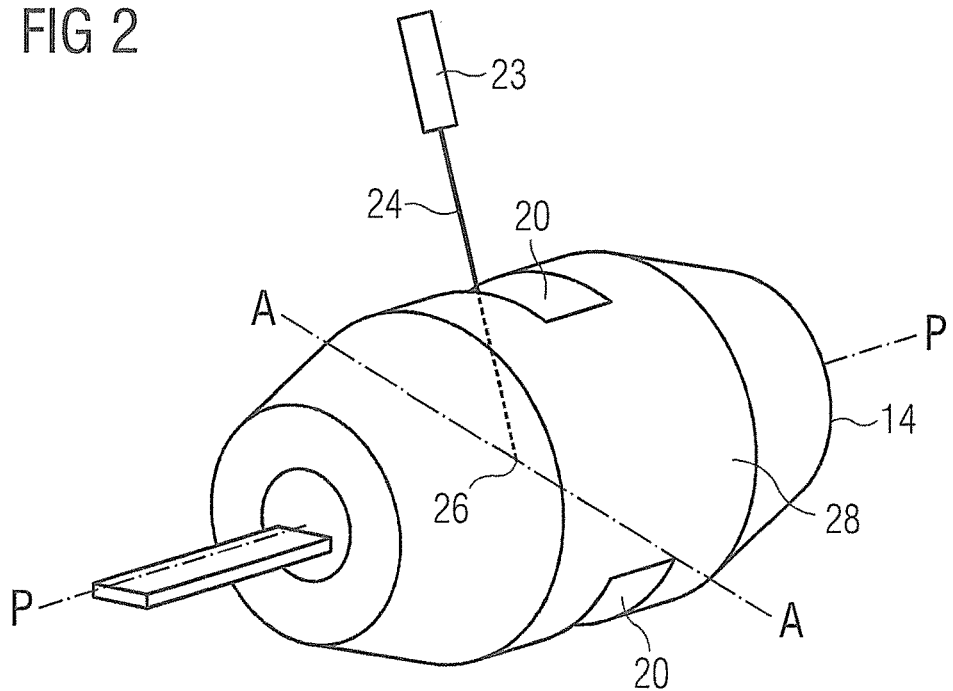
FIG. 2 schematically illustrates a three-dimensional representation of the magnet of FIG. 1.

FIG. 2 shows a schematic three-dimensional illustration of a magnet according to FIG. 1. In this example, the assembly housing 28 of the OVC has rotational symmetry, excluding the beam slots 20, about the patient axis P-P (FIG. 1), rather than conventional rotational symmetry about the magnet axis A-A (FIG. 1). However, it is equally possible to design the OVC to have rotational symmetry about the magnet axis A-A, and aesthetic considerations may determine the design of the OVC. A design such as shown in FIG. 2 may be less intimidating for a patient, but a design symmetrical about the magnet axis A-A may produce an OVC of reduced total volume.

As shown in FIG. 2, beam access cavity 20 preferably extends about patient axis P-P by a significant angle. More than one beam access cavity 20 may be provided about axis P-P, so as to allow increased range of available angles of incidence for the application of a radiation therapy beam to a treatment region 26.

A radiation therapy beam source 23 may be arranged to rotate around the magnet about patient axis P-P, and to direct a radiation therapy beam 24 through a beam access cavity 20 towards a designated treatment region 26. Certain angular regions of the housing 28 about patient axis P-P will be inaccessible to the radiation therapy beam, as those parts of the OVC house parts of coils 10. With the illustrated embodiment, it is only possible to provide beam access cavities 20 near the top and bottom of the magnet assembly: consider FIG. 1 and its symmetry about axis A-A. The patient table 18 may be rotated around the axis P-P within the bore of the magnet. This, combined with rotation of the incident beam 24, enables extensive access to the patient. The source 23 may contain beam conditioning and focusing arrangements, conventional and well known in the field, which will not be discussed in detail here.

It may be preferred to arrange the magnet coils 10 as shown in the plan view in FIG. 1A, and in FIG. 2A, in which both axes A-A and P-P are horizontal, and beam access cavities 20 are provided at opposite sides of the OVC 14.

The embodiments of FIGS. 1-2A are suitable for the application of electromagnetic radiation beams 24 to a treatment region 26 in the presence of a magnetic field B generated by coils 10. As is clear from consideration of FIGS. 1 and 1A, the treatment radiation beam 24 is directed at approximately 45° to the magnetic field B generated by coils 10. A charged particle beam would be dispersed and deflected by such a magnetic field, but a beam of electromagnetic radiation such as gamma radiation is unaffected by the magnetic field.

Figure 3:
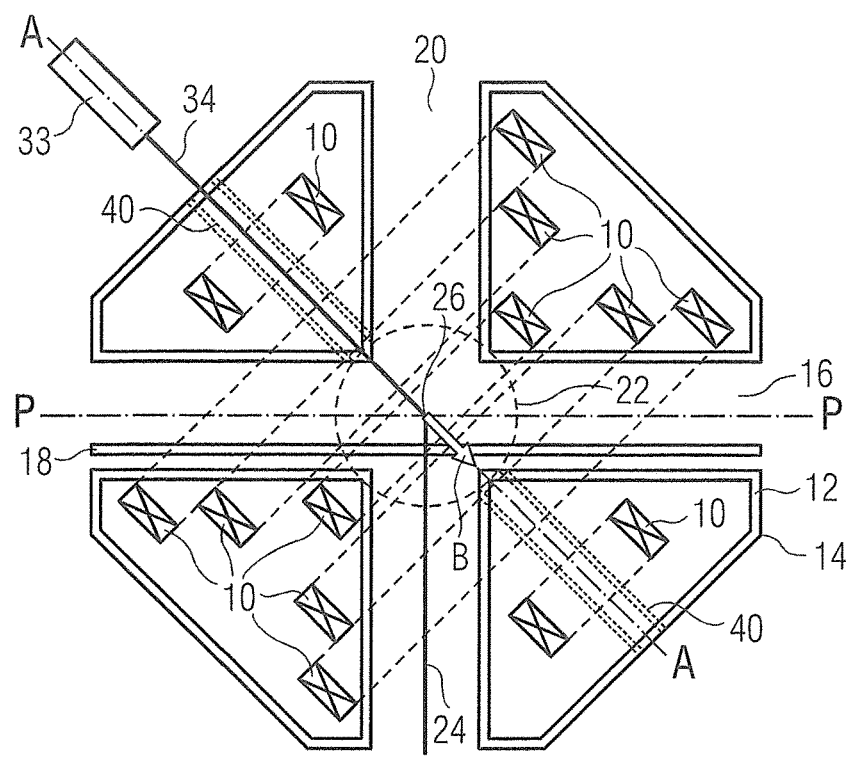
FIG. 3 shows a schematic axial cross-section through an MRI magnet according to another embodiment of the present invention.

FIG. 3 schematically illustrates another embodiment of the present invention. Features common with features shown in FIGS. 1-2A carry corresponding reference numerals. In this embodiment, a charged particle beam 34, provided by charged particle source 33, is directed along the magnet axis A-A.

In the illustrated embodiment, a source 33 of charged particles emits a beam 34 of charged particles along magnet axis A-A, parallel to the magnetic field B of the magnet coils 10. As the beam 34 of charged particles is directed along the magnetic field B, it does not cross any magnetic field lines, and is not deflected or dispersed by the magnetic field B. The source 33 may contain beam conditioning and focusing arrangements, conventional and well known in the field, which will not be discussed in detail here.

The charged particle beam reaches treatment region 26. As the charged particle beam must be directed along axis A-A, no arrangement is provided in this embodiment for rotating the source 33 relative to the magnet. From consideration of FIG. 3, the charged particle beam 34 will need to traverse only a short distance within a patient's body, lying on patient table 18, before reaching the treatment region 26.

Other known combined MRI/radiation therapy systems employing charged particle beams are known, using so-called "open" magnets, with a magnetic field perpendicular to the patient table 18. However, such systems only provide a limited magnetic field strength. The present invention exemplary embodiment provides a magnet resembling a solenoidal magnet, and is able to generate high magnetic field strengths (flux densities), yet still allows charged particle radiation beams to be applied without the beams having to traverse a large distance within a patient's body before reaching the treatment region 26.

Depending on the materials used for the OVC 14 and thermal radiation shield(s) 12, and the type of charged particles used in beam 34, it may be possible to direct the charged particle beam 34 through the material of the OVC and thermal radiation shield(s), as illustrated. Windows of material transparent to the beam 34 may be provided in an otherwise non-transparent OVC and thermal radiation shield. Alternatively, a through-cavity 40, shown in phantom, may be provided to allow passage of the charged particle beam along axis A-A without traversing the OVC or thermal radiation shield(s).

In arrangements such as illustrated in FIG. 3, beam access cavities 20 may be provided, as in the embodiments of FIGS. 1-2A, to allow a beam 24 of electromagnetic radiation to reach the treatment region 26.

Such arrangements may allow combined x-ray or CT imaging with MRI and PET imaging and radiation therapy to provide an all-in-one scanner solution.

The external arrangement of the OVC and radiation source may be essentially as discussed with reference to FIGS. 2 and 2A, with the addition or substitution of a source 33 of a beam 34 of charged particles.

Figure 4:
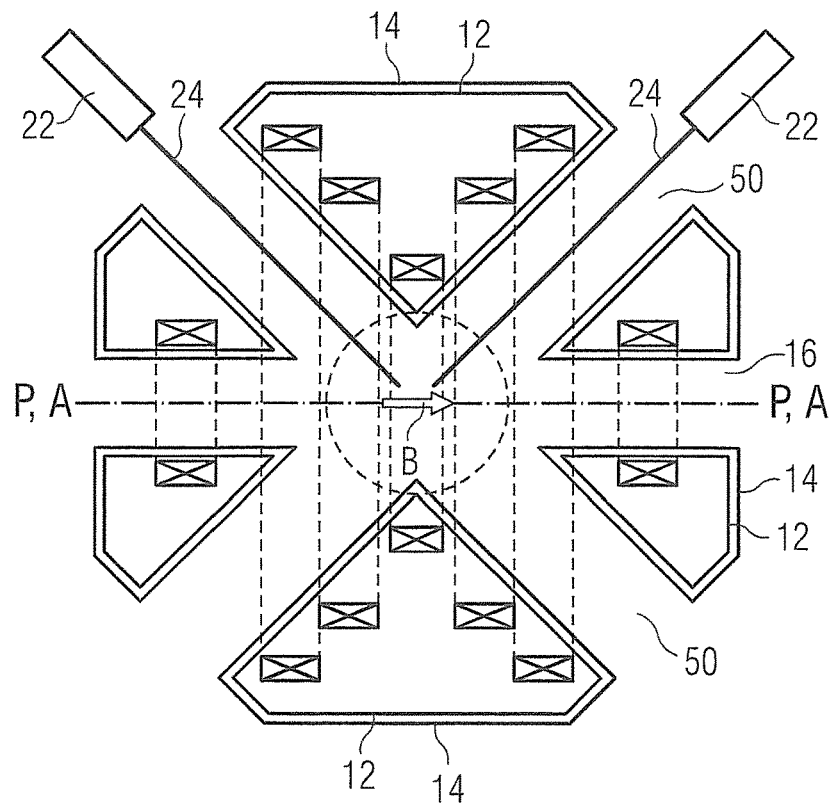
FIG. 4 shows a schematic axial cross-section through an MRI magnet according to further embodiments of the present invention.
Figure 4A:
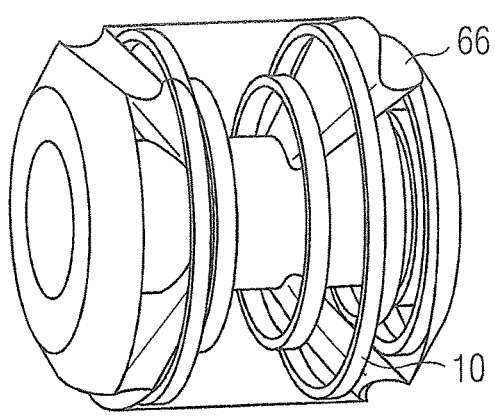
FIGS. 4a, 4b and 4c show views of a 3D CAD model of an embodiment of the present invention, in which locations of gradient coils, passive shims, and a support frame are shown.
Figure 4B:
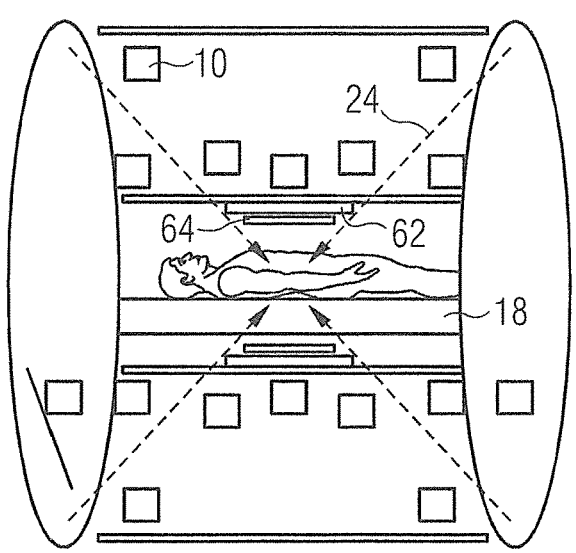
Figure 4C:
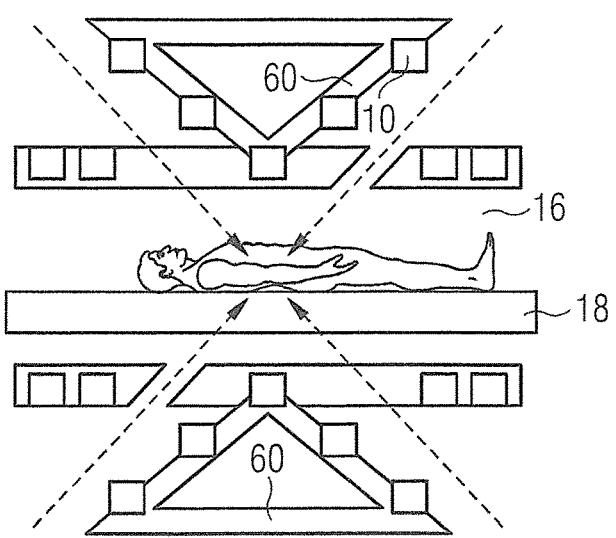

FIG. 4 shows a vertical or horizontal axial cross-section of respective further embodiments of the invention. Features corresponding to features shown in earlier drawings carry corresponding reference numerals. In these embodiments, the patient is placed in patient bore tube 16, which is aligned to the magnet axis. Using the terminology applied to other embodiments, patient bore axis P-P and magnet axis A-A are aligned. In this embodiment, the structure of coils 10, OVC 14 and thermal radiation shield(s) may be essentially rotationally symmetrical about these axes P,A-P,A. The magnetic field B produced by coils 10 will be directed along axes P,A-P,A, as illustrated.

Beam access cavities 50 are provided, inclined at an angle of approximately 45° to the axes P,A-P,A, and similarly inclined to the direction of the magnetic field B. As these beam access cavities are inclined at an angle to the magnetic field generated by the coils 10, this embodiment is unsuitable for the application of charged particle radiation beams, unless the patient bed is also orientated at 45 degrees to the horizontal plane containing axes P,A-P,A and the particle beam is horizontal and parallel to the magnetic field B.

The embodiment of FIG. 4 allows beam axis cavities 50 to extend around axes P,A-P,A by a significant angle, to give a range of available angles of incidence of the radiation beam at the treatment region 26. Some mechanical structure will be required to hold all parts of the assembly together, so certain angles will be inaccessible for each beam source 23. From any available angle, the beam source(s) can direct a beam 24 of electromagnetic radiation to treatment region 26.

FIGS. 4a, 4b and 4c show views of a 3D CAD model of an embodiment such as shown in FIG. 4. FIG. 4a shows the relative positions of coils 10 and beam tubes 66. FIG. 4b shows the relative positions of coils 10, treatment beam directions 24, gradient coils 62 and RF coils 64. FIG. 4c illustrates the relative position of support structures 60 provided to retain coils 10 in place.

An advantage of the embodiment of FIGS. 4-4c is that two, or more, beams 24 of electromagnetic radiation can simultaneously be directed at treatment region 26. This enables each beam to be of lower dosage than in the case that a single beam is used. This reduces the dosage of parts of a patient's body traversed by the treatment beam before it reaches the treatment region 26.

In preferred embodiments of the present invention, superconducting coils 10 are provided, with differing radii and generating an axial magnetic field. Access at an approximately 45° angle to the magnet axis is provided for introduction of a treatment beam. Such embodiments are suitable for electromagnetic treatment beams. In other embodiments, a treatment beam is introduced parallel to the magnet axis, while the patient is retained at an angle of approximately 45° to the direction of the treatment beam. Such embodiments are suitable for charged-particle treatment beams.

While the present invention has been described with reference to a certain number of example embodiments, numerous other variants and modifications will be apparent to those skilled in the art. For example, while the invention has been described with particular reference to superconducting magnets, the invention may also be applied to electromagnets formed of coils of resistive wire, in which no OVC 14 or thermal radiation shield(s) 12 need be provided.

Other variations may include the use of cooling of the magnet coils via direct conduction cooling by cold heads or cryogen-filled cooling loops, and with or without the use of high temperature superconducting wire such as $MgB_2$, which would not require the complication of a cryogen pressure vessel.

The exemplary embodiment structures of the present invention may provide at least some of the following benefits:

- more efficient magnet design and homogeneity by having a magnet geometry that has superconducting coils in the center of the magnet closer to the imaging volume;
- charged particles may be directed parallel to the magnet field B, rather than across a magnet field gradient;
- a more compact MRI system
- no obstruction such as cryostat material need be positioned in the path of the treatment beam, which would otherwise attenuate the treatment beam
- combined MRI and radiation therapy is provided, using a closed MRI magnet, rather than an open system such as provided in the prior art but which is less compact and less efficient;
- the external envelope of magnet is similar to current MRI magnets despite the added functionality of the particle radiation therapy equipment;
- the design of the gradient coil assembly and shimming arrangement does not have to be split along the axis of the magnet as would have to be done for prior art assemblies where the coils are divided between two separate assemblies; and
- a single cryogenic vessel can be used rather than splitting in two, as for certain examples of the prior art, leading to a simplified and reduced-cost solution.

While the described embodiments have provided radiation beam sources 23, 33, which are arranged to rotate about the magnet, alternative embodiments of the present invention have the radiation beam source fixed in position relative to the magnet, and the whole assembly of magnet and beam source can rotate about the axis of the patient bore to provide a required angle of incidence to the patient. In another alternative arrangement, both the magnet and the radiation source remain stationary, while the patient table 18 is arranged to rotate about patient axis P-P. In such arrangements, only a single, relatively narrow, beam access cavity 20 need be provided, allowing a straight passage between the radiation beam source and the treatment region 26.

Although preferred exemplary embodiments are shown and described in detail in the drawings and in the preceding specification, they should be viewed as purely exemplary and not as limiting the invention. It is noted that only preferred exemplary embodiments are shown and described, and all variations and modifications that presently or in the future lie within the protective scope of the invention should be protected.

I claim as my invention:

1. A magnetic resonance imaging (MRI) magnet structure for use with a radiation beam source that emits a radiation therapy beam, in combined MRI/radiation therapy, comprising:

an assembly housing having a fixed patient bore tube extending therethrough;

a plurality of MRI magnet coils of varying diameters concentrically situated in said assembly housing along a same non-vertical magnet axis, which generate a static main magnetic field in said assembly housing, wherein the magnet coils do not share a common inner radius nor a common outer radius and at least some of said magnet coils circumferentially surround said fixed patient bore tube;

the plurality of magnet coils being installed in said assembly housing at fixed positions relative to each other in said assembly housing;

said fixed patient bore tube having a patient bore tube axis that is inclined to the magnet axis by an angle in a range of 30° to 60°, and said patient bore tube having a treatment region therein; and at least one radiation therapy beam access cavity in said assembly housing that provides access from an exterior of said assembly housing for said radiation therapy beam to proceed along a straight line from said exterior of said assembly housing, through said static magnetic field, and into the treatment region in said patient bore tube, so as to allow said radiation therapy beam to be vertical and perpendicular to the patient bore tube when the radiation therapy beam is comprised of neutral particles and to allow said radiation therapy beam to be at a same angle as the magnet axis when said radiation therapy beam is comprised of charged particles.

2. The MRI structure according to claim 1 further comprising a non-spinning patient bed adapted to receive a patient thereon, said patient bed being movable along said patient bore tube axis to enable transport the patient thereon into and out of the patient bore tube.

3. The MRI structure according to claim 1 wherein the radiation therapy beam access cavity extends at an angle of 45° to the magnet axis.

4. The MRI structure according to claim 1 wherein the magnet coils are superconducting, and the assembly housing comprises a cryogen vessel enclosing the magnet coils within a cryogen atmosphere, an outer vacuum container enclosing the cryogen vessel in a vacuum, and at least one thermal radiation shield between the cryogen vessel and the outer vacuum container.

5. The MRI structure according to claim 1 wherein the magnet coils are superconducting, and said assembly housing comprises an outer vacuum container enclosing the magnet coils within a vacuum, and at least one thermal radiation shield between the magnet coils and the outer vacuum container.

6. The MRI structure according to claim 5 wherein the outer vacuum container has rotational symmetry about the patient bore tube axis.

7. The MRI structure according to claim 5 wherein the outer vacuum container has rotational symmetry about the magnet axis.

8. The MRI structure according to claim 5 in which both the magnet axis and the patient bore tube axis are horizontal, and comprising an additional beam access cavity at an opposite side of the outer vacuum container from said beam access cavity.

9. The MRI structure according to claim 5 comprising two radiation beam access cavities, said two radiation beam access cavities being at upper and lower sides of the outer vacuum container, respectively.

10. An apparatus for radiation beam therapy of a subject combined with magnetic resonance imaging (MRI) of the subject, said apparatus comprising:

an apparatus housing having a fixed patient bore tube extending therethrough;

a radiation therapy beam source situated at an exterior of said apparatus housing;

a plurality of MRI magnet coils of varying diameters concentrically situated in said assembly housing along a same non-vertical magnet axis, which generate a static main magnetic field in said assembly housing, wherein the magnet coils do not share a common inner radius nor a common outer radius and at least some of said magnet coils circumferentially surround said fixed patient bore tube;

the plurality of magnet coils being installed in said assembly housing at fixed positions relative to each other in said assembly housing;

said fixed patient bore tube having a patient bore tube axis that is inclined to the magnet axis by an angle in a range of 30° to 60°, and said patient bore tube having a treatment region therein; and a radiation therapy beam access cavity in said apparatus housing that provides access for a radiation therapy beam from said radiation therapy beam source to proceed along a straight line from said radiation therapy beam source, through said static magnetic field, and into the treatment region in said patient bore tube, so as to allow said radiation therapy beam to be vertical and perpendicular to the patient bore tube when the radiation therapy beam is comprised of neutral particles and to allow said radiation therapy beam to be at a same angle as the magnet axis when said radiation therapy beam is comprised of charged particles.

11. An apparatus for administering radiation therapy to a subject combined with magnetic resonance imaging (MRI) of the subject, said apparatus comprising, said fixed patent bore tube having a tube circumference, and a tube cross-section in a plane that contains said tube circumference:

an apparatus housing having a fixed patient bore tube extending therethrough;

a radiation therapy beam source situated at an exterior of said apparatus housing;

a plurality of MRI magnet coils of varying diameters concentrically situated in said assembly housing along a same non-vertical magnet axis, which generate a static main magnetic field in said assembly housing, wherein the magnet coils do not share a common inner radius nor a common outer radius and at least some of said magnet coils circumferentially surround said fixed patient bore tube;

the plurality of magnet coils being installed in said assembly housing at fixed positions relative to each other in said assembly housing;

said fixed patient bore tube having a patient bore tube axis that is inclined to the magnet axis by an angle in a range of 30° to 60°, and said patient bore tube having a treatment region therein; and a first radiation therapy beam access cavity in said apparatus housing that provides access for a radiation therapy beam from said radiation therapy beam source to proceed vertically along a straight line perpendicularly to said patient bore tube axis, through said static magnetic field, and into said treatment region in said patient bore tube, when said radiation therapy beam is comprised of charged particles or neutral particles;

a second radiation therapy beam access cavity in said apparatus housing that provides access for said radiation therapy beam from said radiation beam source to proceed along a straight line from said radiation therapy beam source along a same angle as the magnet axis, through said static magnetic field, and into said treatment region in said patient bore tube, when said radiation therapy beam is comprised of charged particles; and said radiation beam source being selectively positionable to radiate said radiation therapy beam through at least one of said first radiation therapy beam access cavity and said second radiation therapy beam access cavity.

12. The apparatus according to claim 11 wherein the magnet coils are superconducting, the MRI magnet structure further comprises an outer vacuum container enclosing the magnet coils within a vacuum, and at least one thermal radiation shield between the magnet coils and the outer vacuum container.

13. The apparatus according to claim 12 wherein the outer vacuum container has rotational symmetry about the magnet axis.

14. The apparatus according to claim 12 wherein the radiation therapy beam source comprises a charged particle source and the second access cavity is provided to allow passage of charged particles from the charged particle source along the magnet axis without travel through the outer vacuum container or the at least one thermal radiation shield.

15. The apparatus according to claim 12 wherein the outer vacuum container has rotational symmetry about the patient bore tube axis.

16. The apparatus according to claim 12 wherein the radiation therapy beam source comprises a charged particle source which is directed through material of the outer vacuum container and the at least one thermal radiation shield.

17. The apparatus according to claim 16 comprising windows of material transparent to said charged particles in an otherwise non-transparent outer vacuum container and thermal radiation shield for passage of said charged particles from the radiation beam source.

* * * * *